United States Patent
Chang et al.

(10) Patent No.: US 6,873,557 B2
(45) Date of Patent: Mar. 29, 2005

(54) INTEGRATED CIRCUIT DEVICE WITH A BUILT-IN DETECTING CIRCUIT FOR DETECTING MAXIMUM MEMORY ACCESS TIME OF AN EMBEDDED MEMORY

(75) Inventors: Tsin-Yuan Chang, Hsinchu (TW); Ming-Jun Hsiao, Taichung (TW); Shu-Rong Lee, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 0 days.

(21) Appl. No.: 10/601,709

(22) Filed: Jun. 19, 2003

(65) Prior Publication Data

US 2004/0100840 A1 May 27, 2004

(30) Foreign Application Priority Data

Nov. 27, 2002 (TW) ........................................ 91134556 A (51) Int. Cl.[7] ................................................. G11C 7/00
(52) U.S. Cl. .................................... 365/201; 365/189.07
(58) Field of Search ........................... 365/201, 189.05, 365/189.07, 210; 714/732, 167, 724

(56) References Cited

U.S. PATENT DOCUMENTS 5,764,655 A * 6/1998 Kirihata et al. ............. 714/733
6,185,712 B1 * 2/2001 Kirihata et al. ............. 714/732
6,266,749 B1 * 7/2001 Hashimoto et al. ......... 711/167
6,424,583 B1 * 7/2002 Sung et al. .................. 365/201

OTHER PUBLICATIONS

Sung and Wu, *A Method of Embedded Memory Access Time Measurement*, IEEE, 462–465 (2001).
Lee, Hsiao and Chang, *An Access Timing Measurement Unit of Embedded Memory*, IEEE, 104–109 (2002).

* cited by examiner

*Primary Examiner*—Son T. Dinh
(74) *Attorney, Agent, or Firm*—Christensen O'Connor Johnson Kindness PLLC (57) ABSTRACT

An integrated circuit device includes an embedded memory, a built-in self-test (BIST) circuit, an access time measuring circuit, and a built-in detecting circuit. The BIST circuit is coupled electrically to the memory, and is operable so as to perform consecutive test operations upon addressable memory locations of the memory. The access time measuring circuit is coupled electrically to the memory and the BIST circuit, and is operable so as to generate an access time signal corresponding to access time of one of the memory locations that is currently being tested by the BIST circuit. The detecting circuit is coupled electrically to the measuring circuit, monitors a maximum value of the access time signals generated by the measuring circuit during the consecutive test operations, and outputs a maximum access time signal upon completion of the consecutive test operations.

23 Claims, 4 Drawing Sheets

FIG. 3

INTEGRATED CIRCUIT DEVICE WITH A BUILT-IN DETECTING CIRCUIT FOR DETECTING MAXIMUM MEMORY ACCESS TIME OF AN EMBEDDED MEMORY

CROSS-REFERENCE TO RELATED APPLICATION

This application claims priority of Taiwanese application no. 091134556, filed on Nov. 27, 2002.

BACKGROUND OF THE INVENTION

1. Field of the Invention

The invention relates to an integrated circuit device, more particularly to an integrated circuit device with a built-in detecting circuit for detecting maximum memory access time of an embedded memory.

2. Description of the Related Art

In view of recent advancements in the field of semiconductor fabrication technology, system-on-a-chip (SoC) applications are growing at a rapid pace. As a matter of fact, SoC devices are commonly found in many portable applications, such as personal digital assistants, mobile telephones, and even in multi-media products, such as digital cameras, computer games, etc. An SoC device contains millions of logic gates built into a single chip, and includes a processor core, such as a central processing unit or a digital signal processor, an embedded memory, such as a DRAM, SRAM, or flash memory, and an analog core, such as a phase-locked loop, operational amplifiers, etc. The embedded memory, which is used for storing data and instructions, occupies the largest area in SoC devices.

Since memory access time is an important factor commonly considered when determining the quality and price of a product, as to how memory access time can be measured quickly and accurately is an important topic in the industry.

U.S. Pat. No. 6,424,583 discloses a system for measuring access time of a memory that forms part of an integrated circuit chip. In the proposed system, a built-in self-test (BIST) controller and a separate measurement circuit are applied to determine the maximum time period for accessing data stored in an embedded integrated circuit memory. The BIST controller includes a finite state controller for operating state control, a pattern generator for generating a patterned stimulus to be applied to the memory, and a comparator for comparing the stimulus response of the memory to a reference response. The measurement circuit includes logic circuits that operate on data read from the memory, and time delay elements that introduce time delays in the data prior to delivery to the logic circuits.

The aforesaid conventional system is disadvantageous in that, while the built-in measurement circuit is capable of measuring the access time of each addressable location of the embedded memory, external automated test equipment is still needed to determine the maximum memory access time of the embedded memory. Accordingly, since the access time data of each memory location is sent to the external automated test equipment, time delay elements are necessary in the measurement circuit for introducing time delays to the access time data in order to enable measurement of the data by the external automated test equipment. There is also a need for additional circuitry, such as a ring oscillator, to determine the exact amount of the time delays introduced by the delay elements.

SUMMARY OF THE INVENTION

Therefore, the main object of the present invention is to provide an integrated circuit device with a built-in detecting circuit for detecting maximum memory access time of an embedded memory, thereby permitting measurement of the maximum memory access time at a relatively low cost and with relatively high precision.

Another object of the present invention is to provide a detecting circuit suitable in an integrated circuit device for detecting maximum memory access time of an embedded memory of the integrated circuit device.

According to one aspect of the present invention, an integrated circuit device comprises;

an embedded memory having addressable memory locations;

a built-in self-test (BIST) circuit coupled electrically to the memory and operable so as to perform consecutive test operations upon the memory locations of the memory; an access time measuring circuit coupled electrically to the memory and the BIST circuit and operable so as to generate an access time signal corresponding to access time of one of the memory locations that is currently being tested by the BIST circuit; and a built-in detecting circuit coupled electrically to the access time measuring circuit, the detecting circuit monitoring a maximum value of the access time signals generated by the access time measuring circuit during the consecutive test operations, and being operable so as to output a maximum access time signal upon completion of the consecutive test operations.

According to another aspect of the present invention, there is provided a detecting circuit adapted for detecting maximum memory access time internally of an integrated circuit device. The integrated circuit device includes an embedded memory having addressable memory locations, a built-in self-test (BIST) circuit coupled electrically to the memory and operable so as to perform consecutive test operations upon the memory locations of the memory, and an access time measuring circuit coupled electrically to the memory and the BIST circuit and operable so as to generate an access time signal corresponding to access time of one of the memory locations that is currently being tested by the BIST circuit. The detecting circuit comprises a time signal converter and a peak value detector.

The time signal converter is adapted to be coupled electrically to the access time measuring circuit, and is operable so as to convert the access time signal generated by the access time measuring circuit during each of the consecutive test operations into a corresponding compared signal. The peak value detector is coupled electrically to the time signal converter for comparing the compared signal with a reference signal and for updating the reference signal so as to correspond with the compared signal according to result of comparison therebetween.

A maximum value of the access time signals generated during the consecutive test operations is determined from the reference signal upon completion of the consecutive test operations.

BRIEF DESCRIPTION OF THE DRAWINGS

Other features and advantages of the present invention will be come apparent in the following detailed description of the preferred embodiment with reference to the accompanying drawings, of which.

DETAILED DESCRIPTION OF THE PREFERRED EMBODIMENT

Figure 1:
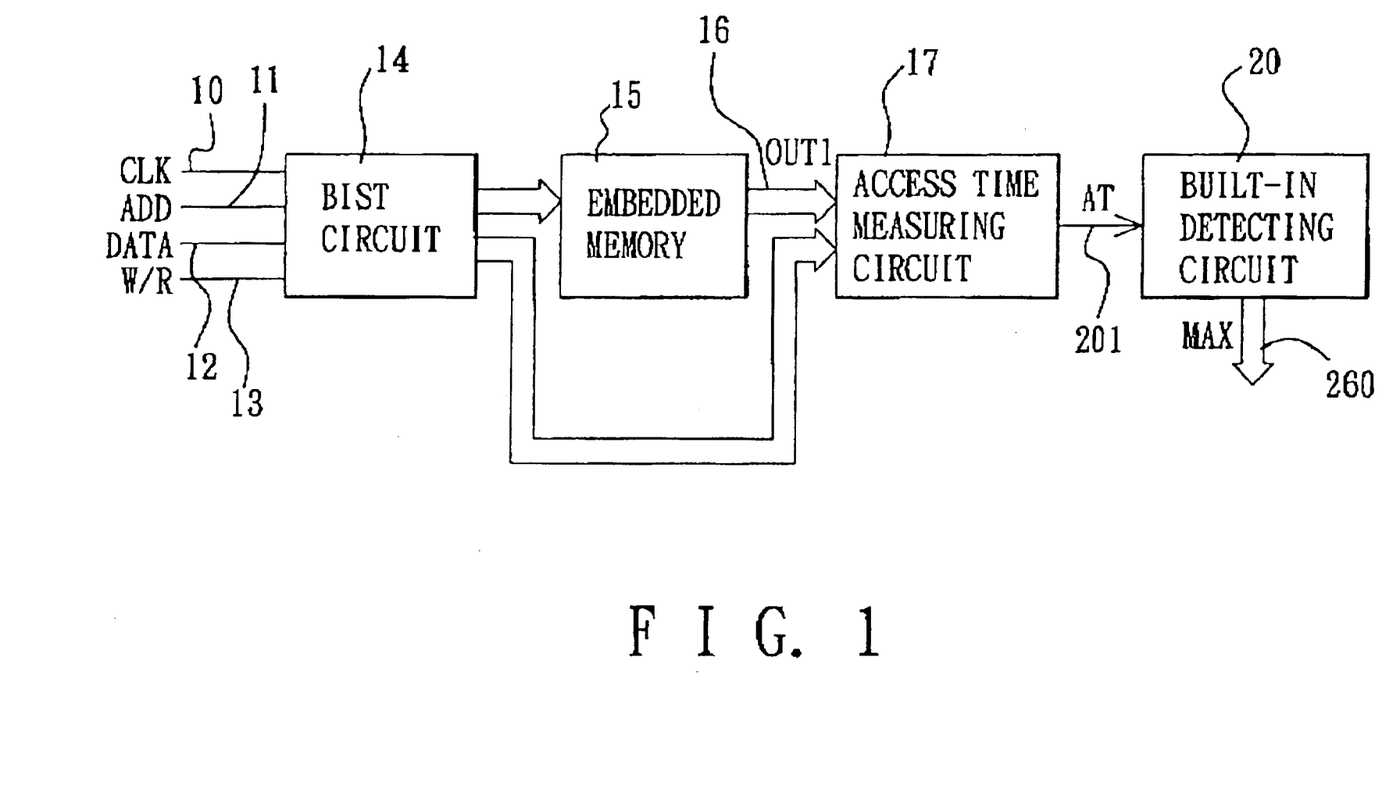
FIG. 1 is a schematic circuit block diagram of the preferred embodiment of an integrated circuit device according to the present invention.

Referring to FIG. 1, the preferred embodiment of an integrated circuit device according to the present invention is shown to include an embedded memory 15 having addressable memory locations, a built-in self-test (BIST) circuit 14 coupled electrically to the memory 15, an access time measuring circuit 17 coupled electrically to the memory 15 and the BIST circuit 14, and a built-in detecting circuit 20 coupled electrically to the access time measuring circuit 17.

Before delivery to customers, the integrated circuit device is subjected to parameter and logic testing operations with the use of the BIST circuit 14. The BIST circuit 14 receives the following signals during testing of the integrated circuit device: a clock (CLK) signal 10, a system address (ADD) signal 11, a system data (DATA) signal 12, and a read/write enable (W/R) control signal 13. The BIST circuit 14 operates according to a conventional test algorithm when measuring memory access time. In this embodiment, the test algorithm is a March C+ algorithm that includes consecutive test operations upon the memory locations of the memory 15, such as:

1. Write 0's to all locations for initialization;
2. Read 0 (i.e., R0) at current location, write 1 (i.e., W1) at current location, read 1 (i.e., R1) at current location, and repeating this series of procedures for the other memory locations in an ascending (or descending) order of the memory locations; and
3. Read 1 (i.e., R1) at current location, write 0 (i.e., W0) at current location, read 0 (i.e., R0) at current location, and repeating this series of procedures for the other memory locations in an ascending (or descending) order of the memory locations.

Therefore, except for the initialization test operation, each of the consecutive test operations includes a first read procedure (R0 or R1) for reading first test data of a tested memory location, a write procedure (W1 or W0) that follows the first read procedure for writing second test data that is the inverse of the first test data in the tested memory location, and a second read procedure (R1 or R0) that follows the write procedure for reading the second test data of the tested memory location.

Since the operating principle of the BIST circuit 14 is known in the art, and since the particular construction of the BIST circuit 14 is not pertinent to the claimed invention, a detailed description of the same will be dispensed with herein for the sake of brevity.

The access time measuring circuit 17 receives the CLK signal 10 and the W/R control signal 13 from the BIST circuit 14, and further receives an output (OUT1) signal 16 generated by the memory 15 in response to the test stimulus applied by the BIST circuit 14. The measuring circuit 17, the operating principle of which is also known in the art, generates an access time (AT) signal 201 for a memory location that is currently being tested by the BIST circuit 14 during the second test procedure of the test operation for the tested memory location.

Figure 2:
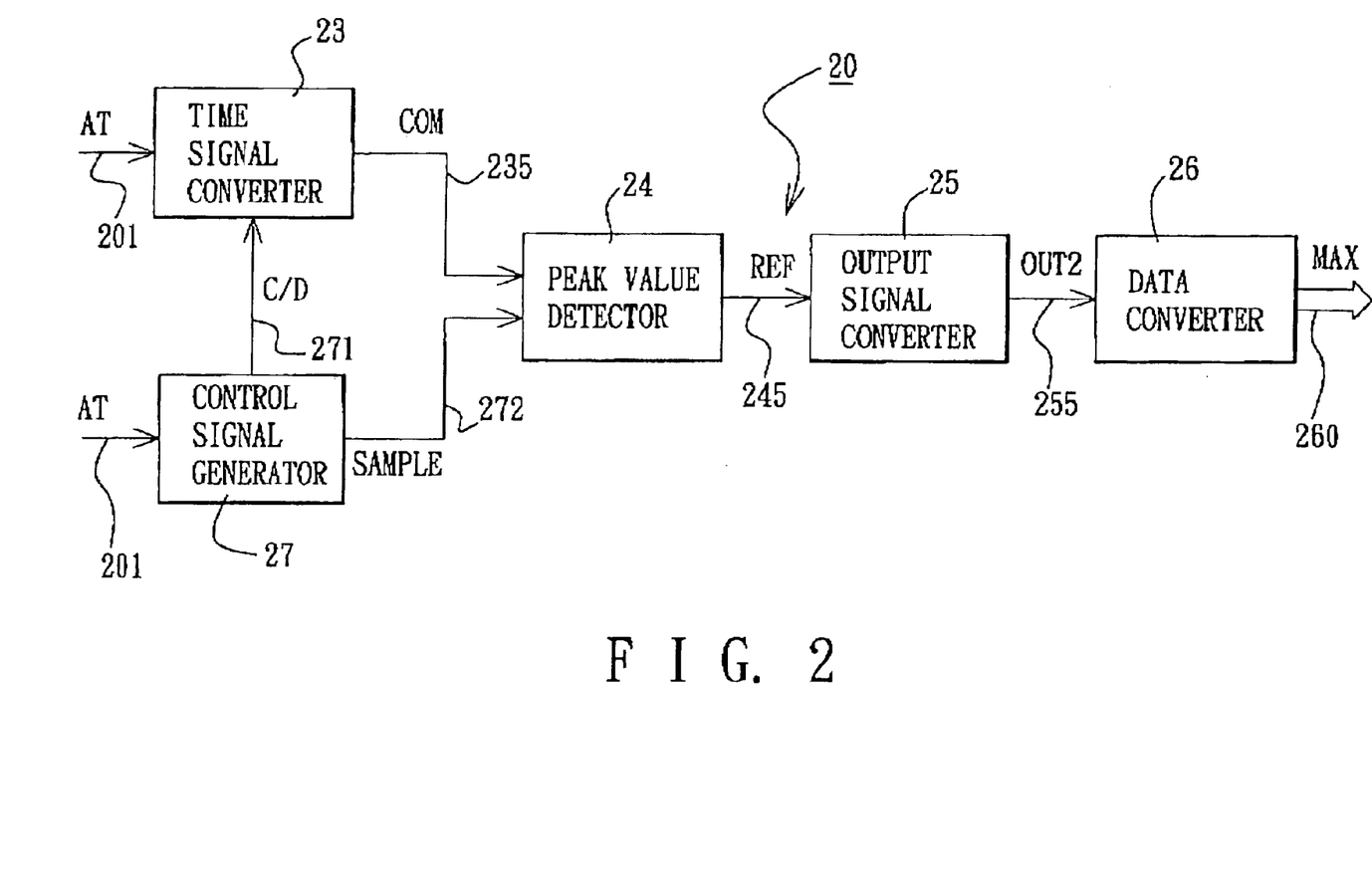
FIG. 2 is a schematic circuit block diagram of a built-in detecting circuit of the preferred embodiment.

Referring further to FIG. 2, the detecting circuit 20 includes a control signal generator 27, a time signal converter 23, a peak value detector 24, an output signal converter 25, and a data converter 26. The detecting circuit 20 monitors a maximum value of the access time (AT) signals 201 generated by the access time measuring circuit 17 during the consecutive test operations, and is operable so as to output a maximum access time (MAX) signal 260 upon completion of the consecutive test operations.

The control signal generator 27 is coupled electrically to the measuring circuit 17, and generates a charge/discharge (C/D) control signal 271 and a SAMPLE control signal 272 upon receipt of the access time (AT) signal 201 generated by the access time measuring circuit 17 during each of the consecutive test operations. The C/D control signal 271 and the SAMPLE control signal 272 are applied to control operations of the time signal converter 23 and the peak value detector 24, respectively.

Figure 3:
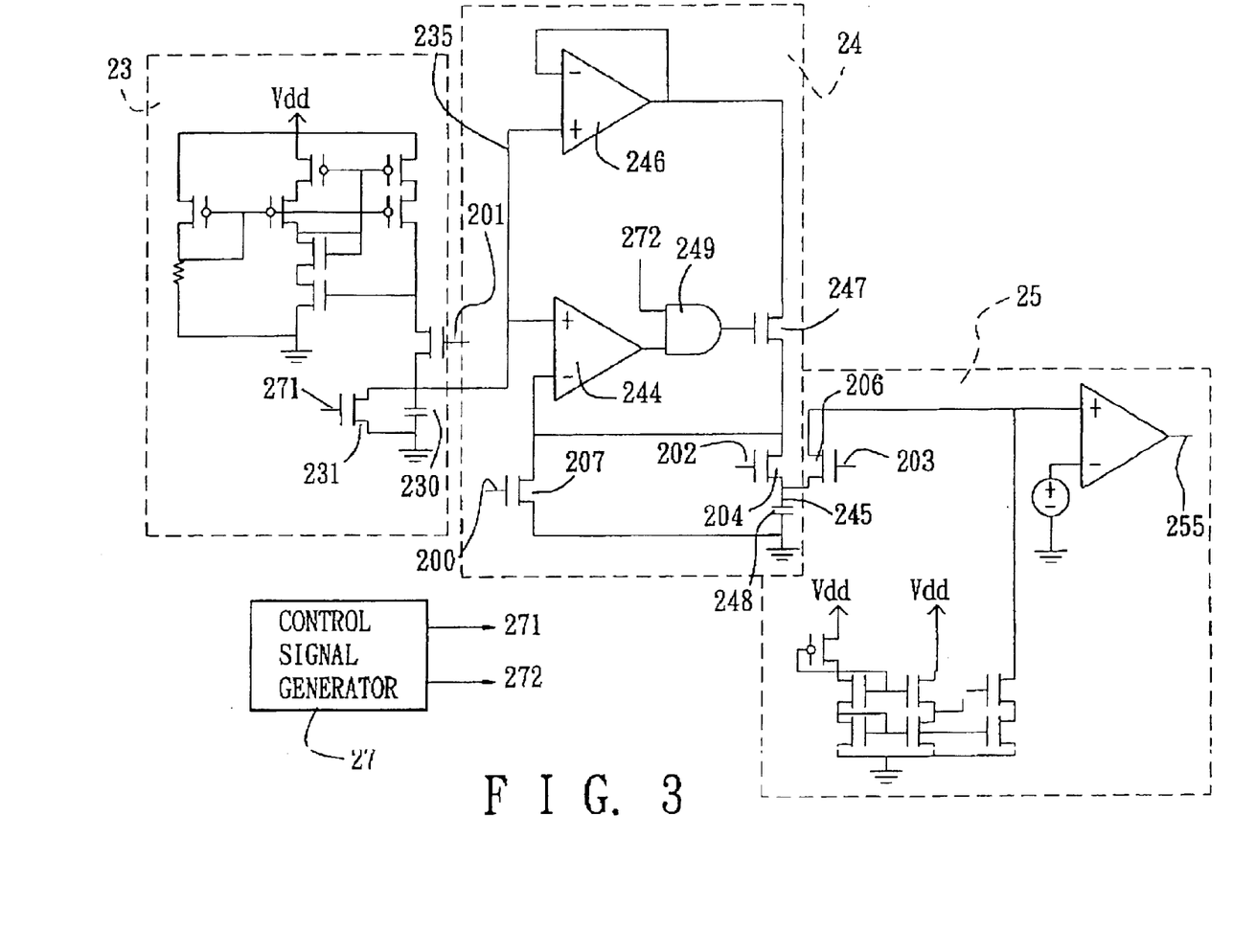
FIG. 3 is a schematic circuit diagram showing a time signal converter, a peak value detector, and an output signal converter of the built-in detecting circuit of the preferred embodiment.

The time signal converter 23 is coupled electrically to the access time measuring circuit 17 for converting the access time (AT) signal 201 generated during each of the consecutive test operations into a corresponding compared (COM) signal 235. In this embodiment, the time signal converter 23 includes a control unit for enabling conversion operation of the time signal converter 23 during a first time period (T1) (see FIG. 4C) starting from generation of the access time (AT) signal 201 associated with a current tested one of the memory locations and ending before generation of the access time (AT) signal 201 associated with a next tested one of the memory locations. As shown in FIG. 3, the time signal converter 23 includes a signal integrator 230, in the form of a capacitor, for converting the access time (AT) signal 201 generated by the access time measuring circuit 17 during each of the consecutive test operations into the corresponding compared (COM) signal 235. The control unit of the time signal converter 23 includes a switch 231 connected across the signal integrator 230 and controlled by the C/D control signal 271 from the control signal generator 27. The switch 231 is thus operable for discharging the signal integrator 230 when the conversion operation of the signal integrator 230 is disabled.

The peak value detector 24 is coupled electrically to the time signal converter 23 for comparing the compared (COM) signal 235 with a reference (REF) signal 245 and for updating the reference (REF) signal 245 so as to correspond with the compared (COM) signal 235 according to result of the comparison made therebetween. The maximum value of the access time (AT) signals 201 is then determined from the reference (REF) signal 245 upon completion of the consecutive test operations. In this embodiment, the peak value detector 24 includes a control device for enabling update operation of the peak value detector 24 during a second time period (T2) (see FIG. 4D) starting from generation of the access time (AT) signal 201 associated with the current tested one of the memory locations and ending before generation of the access time (AT) signal 201 associated with the next tested one of the memory locations. As shown in FIG. 3, the peak value detector 24 includes: a storage element 248, such as a capacitor, for storing the reference (REF) signal 245; a comparator 244, coupled electrically to the storage element 248 through a first control switch 204 and further coupled electrically to the signal integrator 230 of the time signal converter 23, for comparing the compared (COM) signal 235 from the time signal converter 23 with the reference (REF) signal 245 from the storage element 248; a buffer 246 coupled electrically to the time signal converter 23 so as to receive the compared (COM) signal 235 therefrom; and a switch 247, in the form of a transistor, interconnecting the first control switch 204 and the buffer 246. The switch 247 is controlled by the comparator 244 so as to make or break electrical connection between the buffer 246 and the first control switch 204 according to the result of the comparison made by the comparator 244. In this embodiment, the control device of the peak value detector 24 includes a logic gate 249, such as a logic AND gate, interconnecting the switch 247 and the comparator 244 and receiving the SAMPLE control signal 272 from the control signal generator 27. The logic gate 249 is thus operable so as to inhibit the comparator 244 from controlling the switch 247 when the update operation of the peak value detector 24 is disabled.

The peak value detector 24 further includes a reset element 207, in the form of a transistor, connected across the storage element 248. The reset element 207 operates in accordance with a reset signal 200, which may be provided by the BIST circuit 14, so as to discharge the storage element 248.

As mentioned hereinabove, the first control switch 204, in the form of a transistor in this embodiment, is coupled electrically to the storage element 248, the comparator 244, and the switch 247. The first control switch 204 operates according to a first switch control signal 202, which may be provided by the BIST circuit 14, so as to break electrical connection between the storage element 248 and each of the comparator 244 and the switch 247 upon completion of the consecutive test operations.

The output signal converter 25 is coupled electrically to the storage element 248 through a second control switch 206 (see FIG. 3). In this embodiment, an analog form (OUT2) 255 of the detected maximum memory access time can be obtained from the output signal converter 25 upon completion of the consecutive test operations. The second control switch 206 operates according to a second switch control signal 203, which may be provided by the BIST circuit 14, so as to make electrical connection between the storage element 248 and the output signal converter 25 upon completion of the consecutive test operations.

In the preferred embodiment, the data converter 26 is coupled electrically to the output signal converter 25 so that a digital maximum access time (MAX) signal 260 can be obtained therefrom.

An illustrative operating example of the integrated circuit device of this invention will now be described in the following paragraphs.

As described here in above, maximum memory access time is detected internally in the integrated circuit device of this invention by monitoring a maximum value of the access time (AT) signals 201 generated by the access time measuring circuit 17 during the consecutive test operations, and outputting a maximum access time (MAX) signal 260 upon completion of the consecutive test operations.

First, before testing of the integrated circuit device can begin, the reset signal 200 is sent to the reset element 207 to discharge the storage element 248.

Figures 4A, 4B:
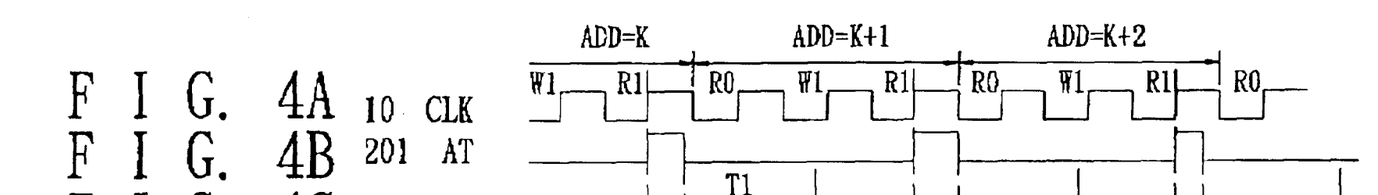
FIGS. 4A to 4F illustrate a clock (CLK) signal, an access time signal, a charge/discharge (C/D) control signal, a sample control signal, a reference signal and a compared signal generated in an operating example of the integrated circuit device of FIG. 1.

FIG. 4A illustrates pulses of the clock (CLK) signal 10 when performing the R0, W1, and R1 procedures of the test operation for each of the addressable locations of the embedded memory 15 (see FIG. 1). In the example of FIG. 4A, the test operations are performed consecutively in an ascending order of the memory locations.

FIG. 4B illustrates the access time (AT) signals 201 generated by the access time measuring circuit 17 (see FIG. 1) during the consecutive test operations. Note that each of the access time (AT) signals 201 is generated during the second read procedure (i.e., R1) of the test operation for the tested memory location.

Figure 4C:
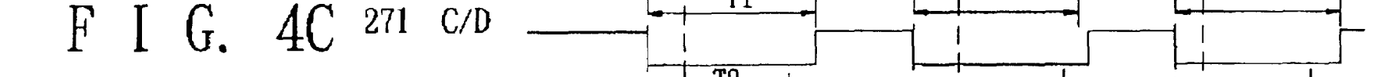
Figures 4D, 4E, 4F:
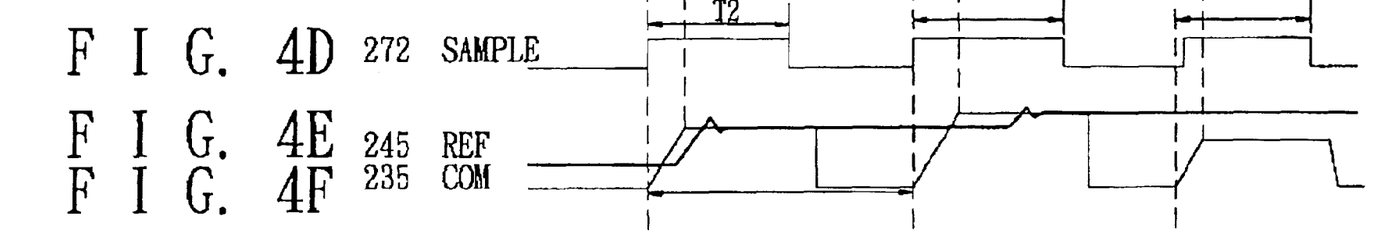

Referring further to FIGS. 4C and 4D, the rising pulse edge of each access time (AT) signal 201 triggers the control signal generator 27 to generate the low-logic C/D control signal 271 with a first time period (T1) and to generate the high-logic SAMPLE control signal 272 with a second time period (T2). Each of the first and second time periods (T1, T2) starts from the rising pulse edge of the access time (AT) signal 201 associated with a current tested one of the memory locations, i.e., address (ADD)=K, and ends before the rising pulse edge of the access time (AT) signal 201 associated with a next tested one of the memory locations, i.e., address (ADD)=K+1. In this embodiment, the second time period (T2) is shorter than the first time period (T1) Preferably, each of the first and second time periods (T1, T2) ends before the rising pulse edge of the write procedure for the test operation of the next tested memory location.

As shown in FIG. 3, the C/D control signal 271 from the control signal generator 27 is received by the switch 231 of the control unit of the time signal integrator 23. When the C/D control signal 271 is at a high logic state, the switch 231 discharges the signal integrator 230 so as to disable the conversion operation of the signal integrator 230. Accordingly, when the C/D control signal 271 is at the low logic state, the signal integrator 230 will be charged by the access time (AT) signal 201 to result in the compared (COM) signal 235 (see FIG. 4F) corresponding to the access time (AT) signal 201.

Moreover, the SAMPLE control signal 272 from the control signal generator 27 is received by the logic gate 249 of the peak value detector 24. When the SAMPLE control signal 272 is at a low logic state, the logic gate 249 inhibits the comparator 244 from controlling the switch 247, thereby disabling update operation of the peak value detector 24. When the SAMPLE control signal 272 is at the high logic state, the comparator 244 is able to control the switch 247 according to the result of a comparison made between the compared (COM) signal 235 from the signal integrator 230 and the reference (REF) signal 245 (see FIG. 4E) stored in the storage element 248. Particularly, when the compared (COM) signal 235 has a magnitude larger than that of the reference (REF) signal 245, the comparator 244 will generate a high logic output that enables the logic gate 249 to activate the switch 247 for making electrical connection between the buffer 246 and the first control switch 204. Since the butter 246 receives the compared (COM) signal 235 from the signal integrator 230, and since the first control switch 204 makes electrical connection between the switch 247 and the storage element 248 until the test operations for all of the memory locations have been completed, the reference (REF) signal 245 stored in the storage element 248 will be updated to the compared (COM) signal 235 from the buffer 246 when the comparator 244 detects that the magnitude of the compared (COM) signal 235 is greater than that of the reference (REF) signal 245.

Therefore, when the consecutive test operations for all of the memory locations of the embedded memory 15 (see FIG. 1) have been completed, a maximum value of the access time (AT) signals 201 generated by the access time measuring circuit 17 (see FIG. 1) can be determined based on the reference (REF) signal 245 stored in the storage element 248. At this time, with reference to FIG. 3, the first control switch 204 can be controlled through the first switch control signal 202 to break electrical connection between the storage element 248 and each of the comparator 244 and the switch 247, and the second control switch 206 can be controlled through the second switch control signal 203 so as to make electrical connection between the storage element 248 and the output signal converter 25. The output signal converter 25 outputs an analog form (OUT2) 255 of the maximum memory access time based on the reference (REF) signal 245 stored in the storage element 248. The data converter 26 then converts the output of the output signal converter 25 into the digital maximum access time (MAX) signal 260, which is subsequently supplied to external equipment.

It should be noted herein that the data converter 26 is an optional component, and that the analog form (OUT2) 255 of the maximum memory access time from the output signal converter 25 may be supplied directly to the external equipment. Moreover, while conversion between time and signal is exemplified in the preferred embodiment through voltage conversion, it is feasible to modify the time signal converter 23, the peak value detector 24, and the output signal converter 25 so that conversion can proceed in the integrated circuit device of this invention through current conversion or charge conversion.

In summary, since the integrated circuit device of the present invention includes a built-in detecting circuit 20, which operates in conjunction with a BIST circuit 14 and an access time measuring circuit 17 for detecting the maximum memory access time of an embedded memory 15 internally of the integrated circuit device, manufacturing costs can be reduced, measuring precision can be increased, and measuring time can be reduced as well. Furthermore, the construction of the access time measuring circuit 17 can be simplified as well since the maximum memory access time is determined internally of the integrated circuit device and not with the use of external automated test equipment.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

We claim:

1. An integrated circuit device comprising:
   an embedded memory having addressable memory locations;
   a built-in self-test (BIST) circuit coupled electrically to said memory and operable so as to perform consecutive test operations upon said memory locations of said memory;
   an access time measuring circuit coupled electrically to said memory and said BIST circuit and operable so as to generate an access time signal corresponding to access time of one of said memory locations that is currently being tested by said BIST circuit; and
   a built-in detecting circuit coupled electrically to said access time measuring circuit, said detecting circuit monitoring a maximum value of the access time signals generated by said access time measuring circuit during the consecutive test operations, and being operable so as to output a maximum access time signal upon completion of the consecutive test operations.

2. The integrated circuit device as claimed in claim 1, wherein said detecting circuit includes:
   a time signal converter coupled electrically to said access time measuring circuit for converting the access time signal generated during each of the consecutive test operations into a corresponding compared signal; and
   a peak value detector coupled electrically to said time signal converter for comparing the compared signal with a reference signal and for updating the reference signal so as to correspond with the compared signal according to result of comparison therebetween;
   the maximum value of the access time signals being determined from the reference signal upon completion of the consecutive test operations.

3. The integrated circuit device as claimed in claim 2, wherein each of the consecutive test operations includes a first read procedure for reading first test data of one of said memory locations that is currently being tested, a write procedure that follows said first read procedure for writing second test data which is the inverse of the first test data in said one of said memory locations that is currently being tested, and a second read procedure that follows said write procedure for reading the second test data of said one of said memory locations that is currently being tested, the access time signal for one of said memory locations that is currently being tested by said BIST circuit being generated during said second read procedure of the test procedure therefor,
   wherein said time signal converter includes a control unit for enabling conversion operation of said time signal converter during a time period starting from generation of the access time signal associated with a current tested one of said memory locations and ending before generation of the access time signal associated with a next tested one of said memory locations, and
   wherein said peak value detector includes a control device for enabling update operation of said peak value detector during the time period starting from generation of the access time signal associated with the current tested one of said memory locations and ending before generation of the access time signal associated with the next tested one of said memory locations.

4. The integrated circuit device as claimed in claim 3, wherein said time signal converter further includes a signal integrator coupled electrically to said access time measuring circuit for converting the access time signal generated during each of the consecutive test operations into the corresponding compared signal, said control unit including a switch connected across said signal integrator and operable so as to discharge said signal integrator when the conversion operation of said signal integrator is disabled.

5. The integrated circuit device as claimed in claim 3, wherein said peak value detector further includes:
   a storage element for storing the reference signal;
   a comparator coupled electrically to said storage element and said time signal converter for comparing the compared signal from said time signal converter with the reference signal from said storage element;
   a buffer coupled electrically to said time signal converter so as to receive the compared signal therefrom; and
   a switch interconnecting said storage element and said buffer, said switch being connected to and being controlled by said comparator so as to make or break electrical connection between said buffer and said storage element according to result of comparison made by said comparator.

6. The integrated circuit device as claimed in claim 5, wherein said control device includes a logic gate interconnecting said switch and said comparator and operable so as to inhibit said comparator from controlling said switch when the update operation of said peak value detector is disabled.

7. The integrated circuit device as claimed in claim 5, wherein said peak value detector further includes a reset element connected across said storage element and operable so as to discharge said storage element.

8. The integrated circuit device as claimed in claim 5, wherein said detecting circuit further includes an output signal converter coupled electrically to said storage element and operable so as to output the maximum access time signal upon completion of the consecutive test operations.

9. The integrated circuit device as claimed in claim 8, wherein said detecting circuit further includes:
   a first control switch coupled electrically to said storage element, said comparator and said switch, said first control switch operable so as to break electrical connection between said storage element and each of said comparator and said switch upon completion of the consecutive test operations; and
   a second control switch coupled electrically to said storage element and said output signal converter and operable so as to make electrical connection between said storage element and said output signal converter upon completion of the consecutive test operations.

10. A detecting circuit adapted for detecting maximum memory access time internally of an integrated circuit device, the integrated circuit device including
   an embedded memory having addressable memory locations,
   a built-in self-test (BIST) circuit coupled electrically to the memory and operable so as to perform consecutive test operations upon the memory locations of the memory, and
   an access time measuring circuit coupled electrically to the memory and the BIST circuit and operable so as to generate an access time signal corresponding to access time of one of the memory locations that is currently being tested by the BIST circuit,
   said detecting circuit comprising:
      a time signal converter adapted to be coupled electrically to the access time measuring circuit and operable so as to convert the access time signal generated by the access time measuring circuit during each of the consecutive test operations into a corresponding compared signal; and
      a peak value detector coupled electrically to said time signal converter for comparing the compared signal with a reference signal and for updating the reference signal so as to correspond with the compared signal according to result of comparison therebetween;
      wherein a maximum value of the access time signals generated during the consecutive test operations is determined from the reference signal upon completion of the consecutive test operations.

11. The detecting circuit as claimed in claim 10, each of the consecutive test operations including a first read procedure for reading first test data of one of the memory locations that is currently being tested, a write procedure that follows the first read procedure for writing second test data which is the inverse of the first test data in said one of the memory locations that is currently being tested, and a second read procedure that follows the write procedure for reading the second test data of said one of the memory locations that is currently being tested, the access time signal for one of the memory locations that is currently being tested by the BIST circuit being generated during the second read procedure of the test operation therefor, wherein:
   said time signal converter includes a control unit for enabling conversion operation of said time signal converter during a time period starting from generation of the access time signal associated with a current tested one of the memory locations and ending before generation of the access time signal associated with a next tested one of the memory locations; and
   said peak value detector includes a control device for enabling update operation of said peak value detector during the time period starting from generation of the access time signal associated with the current tested one of the memory locations and ending before generation of the access time signal associated with the next tested one of the memory locations.

12. The detecting circuit as claimed in claim 11, wherein said time signal converter further includes a signal integrator adapted to be coupled electrically to the access time measuring circuit for converting the access time signal generated during each of the consecutive test operations into the corresponding compared signal, said control unit including a switch connected across said signal integrator and operable so as to discharge said signal integrator when the conversion operation of said signal integrator is disabled.

13. The detecting circuit device as claimed in claim 11, wherein said peak value detector further includes:
   a storage element for storing the reference signal;
   a comparator coupled electrically to said storage element and said time signal converter for comparing the compared signal from said time signal converter with the reference signal from said storage element;
   a buffer coupled electrically to said time signal converter so as to receive the compared signal therefrom; and
   a switch interconnecting said storage element and said buffer, said switch being connected to and being controlled by said comparator so as to make or break electrical connection between said buffer and said storage element according to result of comparison made by said comparator.

14. The detecting circuit as claimed in claim 13, wherein said control device includes a logic gate interconnecting said switch and said comparator and operable so as to inhibit said comparator from controlling said switch when the update operation of said peak value detector is disabled.

15. The detecting circuit as claimed in claim 13, wherein said peak value detector further includes a reset element connected across said storage element and operable so as to discharge said storage element.

16. The detecting circuit as claimed in claim 13, further comprising an output signal converter coupled electrically to said storage element and operable so as to output a maximum access time signal corresponding to the reference signal upon completion of the consecutive test operations.

17. The detecting circuit as claimed in claim 16, further comprising:
   a first control switch coupled electrically to said storage element, said comparator and said switch, said first control switch being operable so as to break electrical connection between said storage element and each of said comparator and said switch upon completion of the consecutive test operations; and
   a second control switch coupled electrically to said storage element and said output signal converter and operable so as to make electrical connection between said storage element and said output signal converter upon completion of the consecutive test operations.

18. A method for detecting maximum memory access time internally of an integrated circuit device, the integrated circuit device including an embedded memory having addressable memory locations, a built-in self-test (BIST)

circuit coupled electrically to the memory and operable so as to perform consecutive test operations upon the memory locations of the memory, and an access time measuring circuit coupled electrically to the memory and the BIST circuit and operable so as to generate an access time signal corresponding to access time of one of the memory locations that is currently being tested by the BIST circuit, each of the consecutive test operations including a first read procedure for reading first test data of one of the memory locations that is currently being tested, a write procedure that follows the first read procedure for writing second test data which is the inverse of the first test data in said one of the memory locations that is currently being tested, and a second read procedure that follows the write procedure for reading the second test data of said one of the memory locations that is currently being tested, the access time signal for one of the memory locations that is currently being tested by the BIST circuit being generated during the second read procedure of the test operation therefor, said method comprising the steps of:
a) monitoring a maximum value of the access time signals generated by the access time measuring circuit during the consecutive test operations; and
b) outputting a maximum access time signal upon completion of the consecutive test operations.

19. The method as claimed in claim 18, wherein said step a) includes the sub-steps of:
a-1) converting the access time signal generated by the access time measuring circuit during each of the consecutive test operations into a corresponding compared signal; and
a-2) comparing the compared signal with a reference signal and updating the reference signal so as to correspond with the compared signal according to result of comparison therebetween;
wherein the maximum value of the access time signals is determined based on the reference signal upon completion of the consecutive test operations.

20. The method as claimed in claim 19, wherein each of sub-steps a-1) and a-2) is performed during a time period starting from generation of the access time signal associated with a current tested one of said memory locations and ending before generation of the access time signal associated with a next tested one of said memory locations.

21. The method as claimed in claim 20, wherein the maximum access time signal outputted in said step b) is an analog signal.

22. The method as claimed in claim 20, where in the maximum access time signal outputted in said step b) is a digital signal.

23. A detecting circuit adapted for detecting maximum memory access time internally of an integrated circuit device, the integrated circuit device including an embedded memory having addressable memory locations, a built-in self-test (BIST) circuit coupled electrically to the memory and operable so as to perform consecutive test operations upon the memory locations of the memory, and an access time measuring circuit coupled electrically to the memory and the BIST circuit and operable so as to generate an access time signal corresponding to access time of one of the memory locations that is currently being tested by the BIST circuit, each of the consecutive test operations including a first read procedure for reading first test data of one of the memory locations that is currently being tested, a write procedure that follows the first read procedure for writing second test data which is the inverse of the first test data in said one of the memory locations that is currently being tested, and a second read procedure that follows the write procedure for reading the second test data of said one of the memory locations that is currently being tested, the access time signal for one of the memory locations that is currently being tested by the BIST circuit being generated during the second read procedure of the test operation therefor, said detecting circuit comprising:
monitoring means, adapted to be coupled electrically to the access time measuring circuit, for monitoring a maximum value of the access time signals generated by the access time measuring circuit during the consecutive test operations; and
output means, coupled electrically to said monitoring means, for outputting a maximum access time signal upon completion of the consecutive test operations;
wherein said monitoring means is enabled during a time period starting from generation of the access time signal associated with a current tested one of said memory locations and ending before generation of the access time signal associated with a next tested one of said memory locations.

* * * * *